(12) United States Patent
Tanzawa (10) Patent No.: US 8,208,305 B2
(45) Date of Patent: Jun. 26, 2012

(54) ARRANGEMENT OF PAIRS OF NAND STRINGS THAT SHARE BITLINE CONTACTS WHILE UTILIZING DISTINCT SOURCES LINES

(75) Inventor: Toru Tanzawa, Tokyo (JP)

(73) Assignee: Intel Corporation, Santa Clara, CA (US)

( * ) Notice: Subject to any disclaimer, the term of this patent is extended or adjusted under 35 U.S.C. 154(b) by 211 days.

(21) Appl. No.: 12/655,157

(22) Filed: Dec. 23, 2009

(65) Prior Publication Data

US 2011/0149655 A1    Jun. 23, 2011

(51) Int. Cl.
*G11C 11/34* (2006.01)
(52) U.S. Cl. ............ 365/185.17; 365/185.2; 365/185.28
(58) Field of Classification Search .................. None
See application file for complete search history.

(56) References Cited

U.S. PATENT DOCUMENTS

| | | | | |
|---|---|---|---|---|
| 5,392,238 A * | 2/1995 | Kirisawa | .................. | 365/185.13 |
| 5,912,489 A * | 6/1999 | Chen et al. | .................... | 257/321 |
| 5,978,265 A * | 11/1999 | Kirisawa et al. | ......... | 365/185.17 |
| 7,239,556 B2 * | 7/2007 | Abe et al. | ................. | 365/185.33 |
| 7,411,825 B2 * | 8/2008 | Kutsukake et al. | ...... | 365/185.17 |
| 7,535,764 B2 * | 5/2009 | Chin et al. | ................. | 365/185.2 |
| 2008/0144378 A1 * | 6/2008 | Park et al. | ................. | 365/185.05 |

OTHER PUBLICATIONS

"A 120mm2 16Gb 4-MLC NAND Flash Memory with 43nm CMOS Technology"; 2008 IEEE International Solid State Circuits Conference; Session 23 / Non-Volatile Memory; Digest of Technical Papers; Feb. 6, 2008; 3 pages.

Takeuchi, Ken et al.; "A Double-Level-Vth Select Gate Array Architecture for Multilevel NAND Flash Memories"; IEEE Journal of Solid-State Circuits; vol. 31, No. 4, Apr. 1996; 8 pages.

* cited by examiner

*Primary Examiner* — Alexander Sofocleous
(74) *Attorney, Agent, or Firm* — Winkle, PLLC (57) ABSTRACT

A non-volatile microelectronic memory that has a memory cell array, which includes memory cell string pairs that share a bitline contact, that have separate source lines, and that have at least two transistors within each memory cell string that may be programming for sharing the bitline contact.

26 Claims, 9 Drawing Sheets

ARRANGEMENT OF PAIRS OF NAND STRINGS THAT SHARE BITLINE CONTACTS WHILE UTILIZING DISTINCT SOURCES LINES

BACKGROUND OF THE INVENTION

In the production of non-volatile memory devices, there is a continuous drive to reduce the size of the integrated circuit components that form these devices. However, a reduction in the distance between bitlines of a memory cell array can result in increased bitline capacitance. This increase in bitline capacitance can result in longer read operation times of the non-volatile memory device.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Memory devices are integrated circuits that provide data storage of electronics devices, including volatile memory which loses stored information when not powered (e.g., RAM—Random Access Memory) and non-volatile memory, which retain stored information even when not powered (e.g., flash memory). Non-volatile flash memory is generally used in portable devices, such as cellular telephones, personal digital assistants, portable digital media players, digital cameras, as well as, solid state computer hard drives, and the like.

Flash memory devices may include a plurality of memory cells, which are floating-gate transistors. The memory cells are typically stacked gated structures comprising a floating gate formed between a source and drain region on a semiconductor substrate, such as a mono-crystalline silicon material. The floating gate is electrically isolated from the underlying semiconductor substrate by a thin dielectric layer, and a control gate positioned which is positioned above the floating gate and electrically isolated therefrom by an inter-poly dielectric layer. The floating gate serves as a charge storage element for storing an electrical charge. This charge storage defines the memory state of that transistor, wherein the presence or lack of a stored charge represents a binary "1" or "0" state in one data bit.

A NAND flash memory has a cell array that includes a number of cell strings, each cell string constructed of memory cells connected in series. When a NAND flash memory is programmed utilizing the Fowler-Nordheim tunneling effect, a low voltage of about 0 volts is applied to the source and drain while a voltage of about 15 volts is applied to the control gate, so that electrons are injected into the floating gate from the semiconductor substrate to raise a threshold voltage thereof. It is referred to as being written with data "0" to become a programmed cell. When the flash memory is erased also utilizing the Fowler-Nordheim tunneling effect, a negative voltage of about 20 volts is applied to the control gate while a high voltage is applied to the semiconductor substrate, so that electrons move into the semiconductor substrate from the floating gate to lower a threshold voltage thereof. It stores a data "1" to become an erased cell.

Embodiments of the present disclosure relate to the fabrication of non-volatile microelectronic memory. In at least one embodiment, the present disclosure relates to a non-volatile microelectronic memory that has a memory cell array, which includes memory cell string pairs that share a bitline contact, that have separate source lines, and that have at least two transistors within each memory cell string that may be programmed for sharing the bitline contact.

Figure 1:
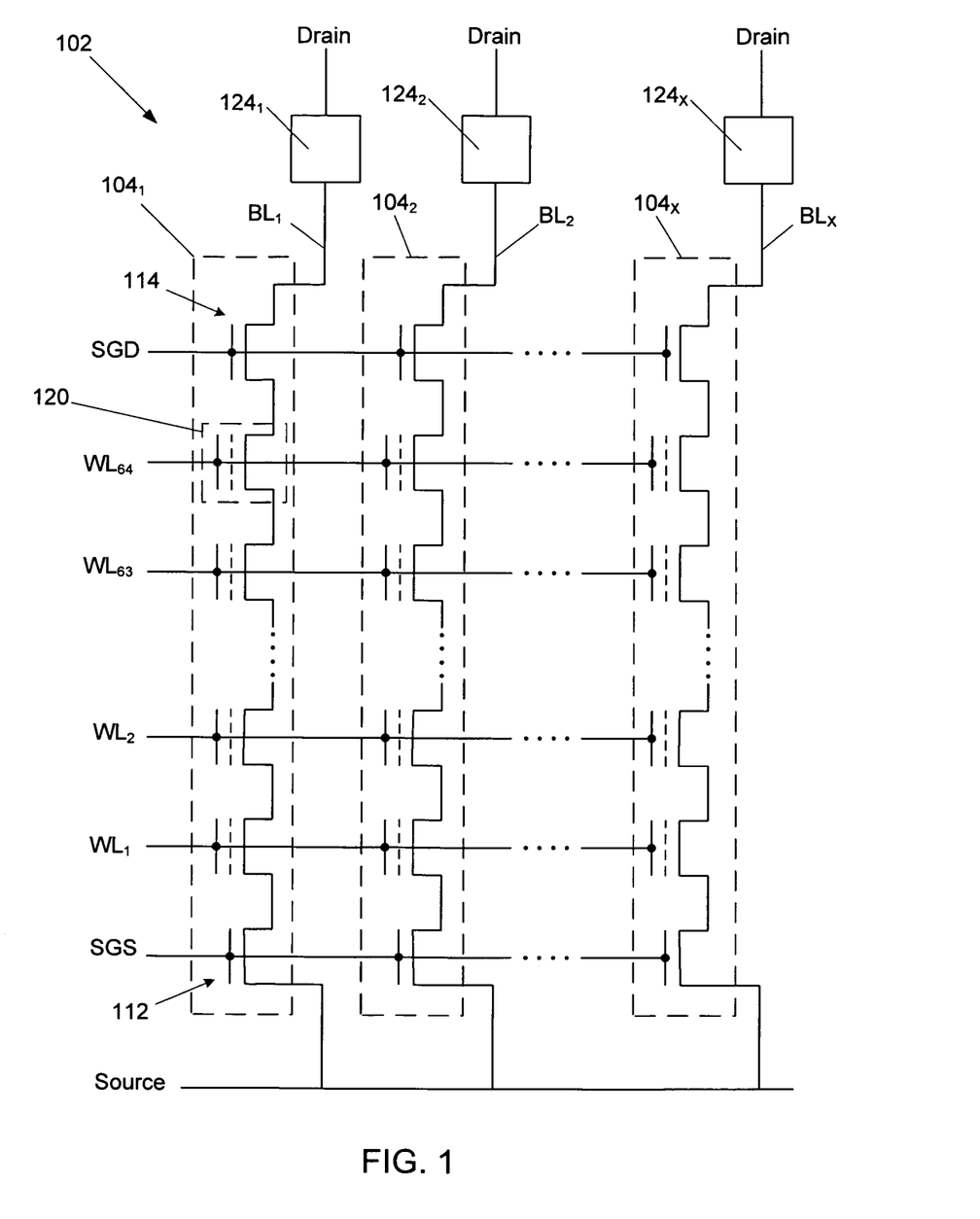
FIG. 1 is a circuit schematic of a NAND flash array.

FIG. 1 is a circuit diagram illustrating a NAND flash memory circuit. The NAND flash memory circuit includes a memory cell array 102 which is composed of a number of flash memory cell strings $104_1, 104_2, \ldots,$ and $104_X$ connected to respective bitlines, $BL_1, BL_2, \ldots,$ and $BL_X$. While FIG. 1 illustrates three cell strings for convenience, it is understood that there may be any number of flash memory cell strings (represent as "x") within the memory cell array 102 in accordance with the dimension of a desired NAND flash memory device.

Each flash memory cell string $104_1$, $104_2$, ..., and $104_X$ includes a source selection transistor gate 112, a ground selection transistor gate 114, and a number of flash memory cells 120 connected in series between the source selection transistor gate 112 and the ground selection transistor gate 114. The source selection transistor gate 112, the ground selection transistor gate 114, and the flash memory cells 120 of each string are coupled to a select gate source SGS, wordlines $WL_1$, $WL_2$, ..., $WL_{63}$, and $WL_{64}$, and a select gate drain SGD, respectively. The select gate source SGS, wordlines $WL_1$, $WL_2$, ..., $WL_{63}$, and $WL_{64}$, and a select gate drain SGD carry outputs from a row decoder (not shown). Each flash memory cell string $104_1$, $104_2$, ..., and $104_X$ is connect to a bitline contact $124_1$, $124_2$, ..., and $124_X$.

The microelectronic industry continues to strive to increase the performance of microelectronic devices by reducing the size of the components therein through the use of more and more advanced processes. However, in memory circuits, a reduction in size results in an increased bitline capacitance due to the distance between the bitlines being reduced. This increase in bitline capacitance can result in longer read operation times, as will be understood to those skilled in the art. Furthermore, the reducing the distance between bitlines may also be more difficult to pattern and has a higher processing costs due to the more advanced processes, such as double pitch lithography techniques.

Figure 2:
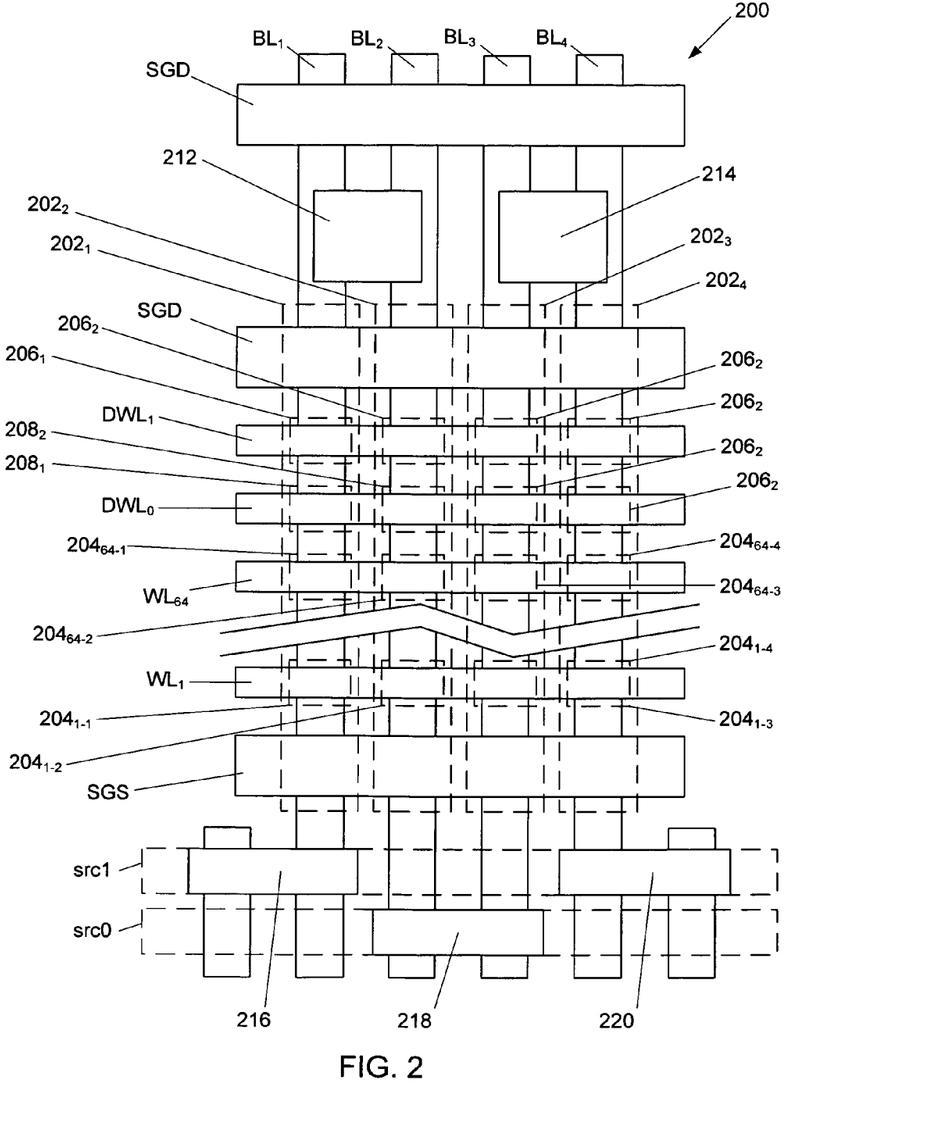
FIG. 2 is a top view of a NAND flash array having dummy memory cells and shared bitline contacts, according to one embodiment of the present subject matter.

FIG. 2 illustrates an embodiment of the present description of a memory cell array 200. The memory cell array 200 may include a first memory cell string $202_1$ having a number of memory cells $204_{1-1}$, ..., $204_{64-1}$ and a second memory cell string $202_2$ having a number of memory cells $204_{1-2}$, ..., $204_{64-2}$. As will be understood to those skilled in the art, the memory cells reside at the intersection of bitlines $BL_1$, $BL_2$, $BL_3$, $BL_4$ and wordlines $WL_1$, ..., $WL_{64}$. Memory cells in adjacent memory cell strings are connected through the wordlines. For example, the first memory cell $204_{1-1}$ of the first memory cell string $202_1$ is connected to the first memory cell $206_{1-2}$ of the second memory cell string $202_2$ with a first wordline $WL_1$, and so on through the memory cells until the sixty-fourth memory cell $208_{64-1}$ of the first memory cell string $202_1$ is connected to the sixty-fourth memory cell $208_{64-2}$ of the second memory cell string $202_2$ with a sixty-fourth wordline $WL_{64}$.

It is understood that any appropriate number of bitlines $BL_1$, $BL_2$, $BL_3$, $BL_4$ and wordlines $WL_1$, ..., $WL_{64}$ may be used to form the memory cell array 200, and the illustrated number is merely exemplary. The memory cell array 200 also includes a select gate drain SGD and a select gate source SGS in communication with the bitlines $BL_1$, $BL_2$, $BL_3$, $BL_4$ in the manner discussed with regard to FIG. 1.

As shown in FIG. 2, the first memory cell string $202_1$ and the second memory cell string $202_2$ may each include at least two transistors that may be programmed for sharing a bitline contact, and in this embodiment, shown as first dummy cell $206_1$, $206_2$ and a second dummy cell $208_1$, $208_2$, respectively. Dummy cells in adjacent memory cell strings are connected through dummy wordlines. For example, the first dummy cell $206_1$ of the first memory cell string $202_1$ is connected to the first dummy cell $206_2$ of the second memory cell string $202_2$ with a first dummy wordline $DWL_1$, and the second dummy cell $208_1$ of the first memory cell string $202_1$ is connected to the second dummy cell $208_2$ of the second memory cell string $202_2$ with a second dummy wordline $DWL_0$.

The memory cell array 200 may further include a first bitline contact 212 that is connected to the first memory cell string $202_1$ and the second memory cell string $202_2$.

The memory cell array 200 may include a first source line "scr1" connected to the first memory cell string $202_1$ through a first source line contact 216 connected to bitline $BL_1$, and a second source line "scr0" connected to the second memory cell string $202_2$ through a second source line contact 218 connected to bitline $BL_2$.

As further shown in FIG. 2, the memory cell array 200 may further include a third memory cell string $202_3$ having a number of memory cells $204_{1-3}$, ..., $204_{64-3}$ and a fourth memory cell string $202_4$ having a number of memory cells $204_{1-4}$, ..., $204_{64-4}$. The third memory cell string $202_3$ and the fourth memory cell string $202_4$ may each include a first dummy cell $206_3$, $206_4$ and a second dummy cell $208_3$, $208_4$, respectively. The first dummy cell $206_3$ of the third memory cell string $202_3$ is connected to the first dummy cell $206_4$ of the fourth memory cell string $202_4$ with the first dummy wordline $DWL_1$, and the second dummy cell $208_3$ of the third memory cell string $202_3$ is connected to the first dummy cell $208_4$ of the fourth memory cell string $202_4$ with the second dummy wordline $DWL_0$.

The memory cell array 200 may further include a second bitline contact 214 that is connected to the third memory cell string $202_3$ and the fourth memory cell string $202_4$.

The first source line "scr1" may be connected to the fourth memory cell string $202_4$ through a third source line contact 220 connected to $BL_4$ and the second source line "scr0" connected to the third memory cell string $202_3$ through the second source line contact 218 connected to bitline $BL_3$, which is shared with the bitline $BL_2$ of the second memory cell string $202_2$.

The incorporation of a shared bitline contact and the use of separate source lines for memory cell strings sharing the bitline contact can result in improve performance for a memory device without having to reduce the pitch of the bitlines in the memory array.

Figure 3:
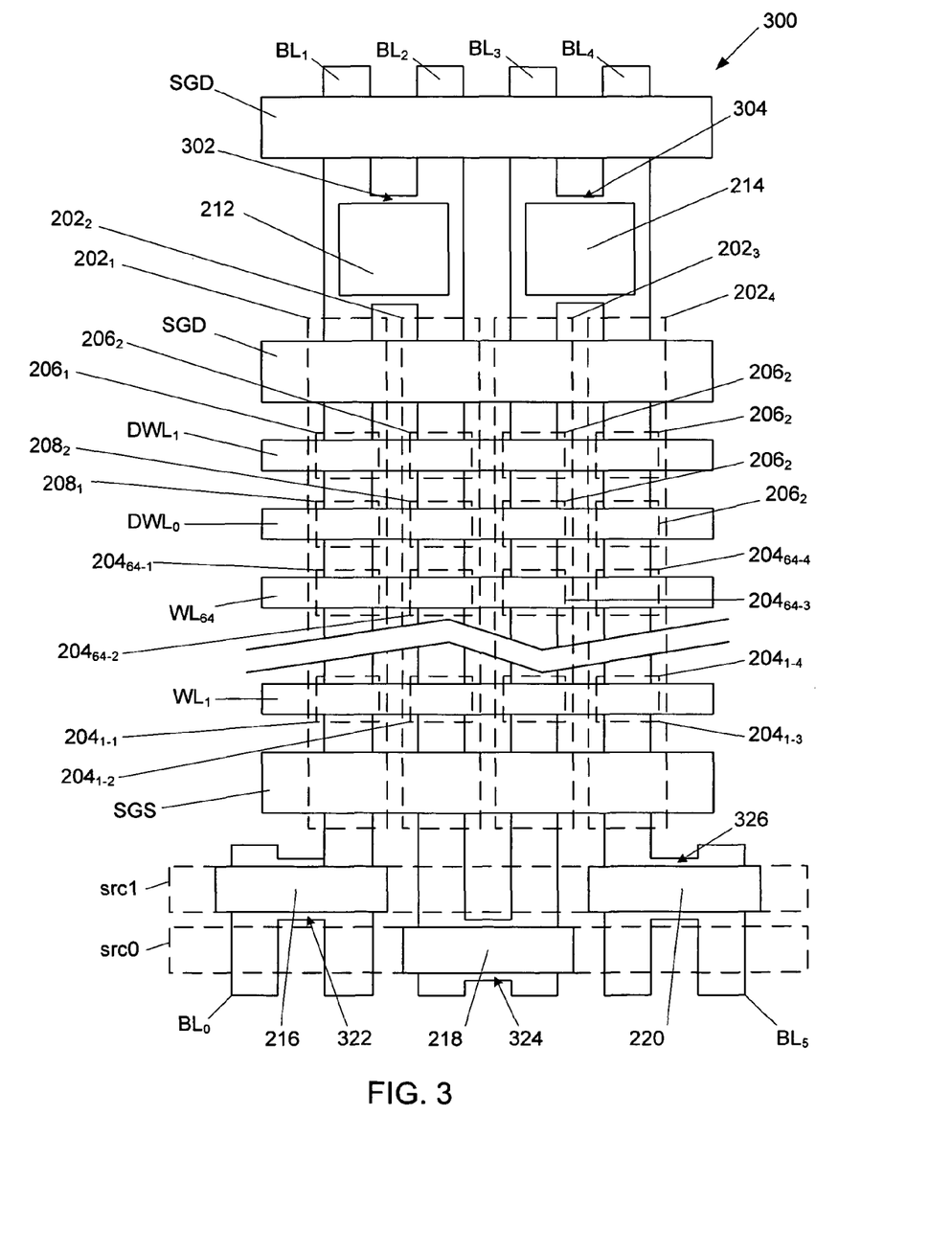
FIG. 3 is a top view of a NAND flash array having dummy memory cells and shared bitline contacts, according to another embodiment of the present subject matter.

Another embodiment of the present description is illustrated in FIG. 3. The memory cell array 300 differs from the memory cell array 200 of FIG. 2 in that a bitline active area 302 is formed between the first memory cell string $202_1$ and the second memory cell string $202_2$, and a bitline active area 304 formed between the third memory cell string $202_3$ and the fourth memory cell string $202_4$. The formation of the bitline active area 302 may result in a more effective contact between the bitline contact 212 and its respective bitlines $BL_1$ and $BL_2$. Likewise, the formation of the bitline active area 304 may result in a more effective contact between the bitline contact 214 and its respective bitlines $BL_3$ and $BL_4$.

The memory cell array 300 of FIG. 3 further differs from the memory cell array 200 of FIG. 2 in that a first source line first active area 322 is formed between the bitline $BL_1$ and an adjacent bitline $BL_O$, a second source line first active area 324 is formed between the bitline $BL_2$ and the bitline $BL_3$, and a first source line second active area 326 is formed between $BL_3$ and an adjacent bit line $BL_5$. The formation of the source line active areas may result in a more effective contact between the bitlines sharing a common source line contact 216, 218, 220 and their respective bitlines The sharing of a bitline contact by two memory cell string can be effectuated by programming the dummy memory cells with differing threshold voltages. For example, TABLE 1 shows a programming arrangement for any of the two memory dummy cell strings, such as dc1-1 corresponding to the first dummy cell $206_1$ of the first memory cell string $202_1$, dc0-1 corresponding to the second dummy cell $208_1$ of the first memory cell string $202_1$, dc1-2 corresponding to the first dummy cell $206_2$ of the second memory cell string $202_2$, and dc0-2 corresponds to the second dummy cell $208_2$ of the second memory cell string $202_2$.

TABLE 1

| Dummy Memory Cell | Threshold Voltage |
| --- | --- |
| dc1-1 | −2 V |
| dc0-1 | +2 V |
| dc1-2 | +2 V |
| dc0-2 | −2 V |

Figure 4:
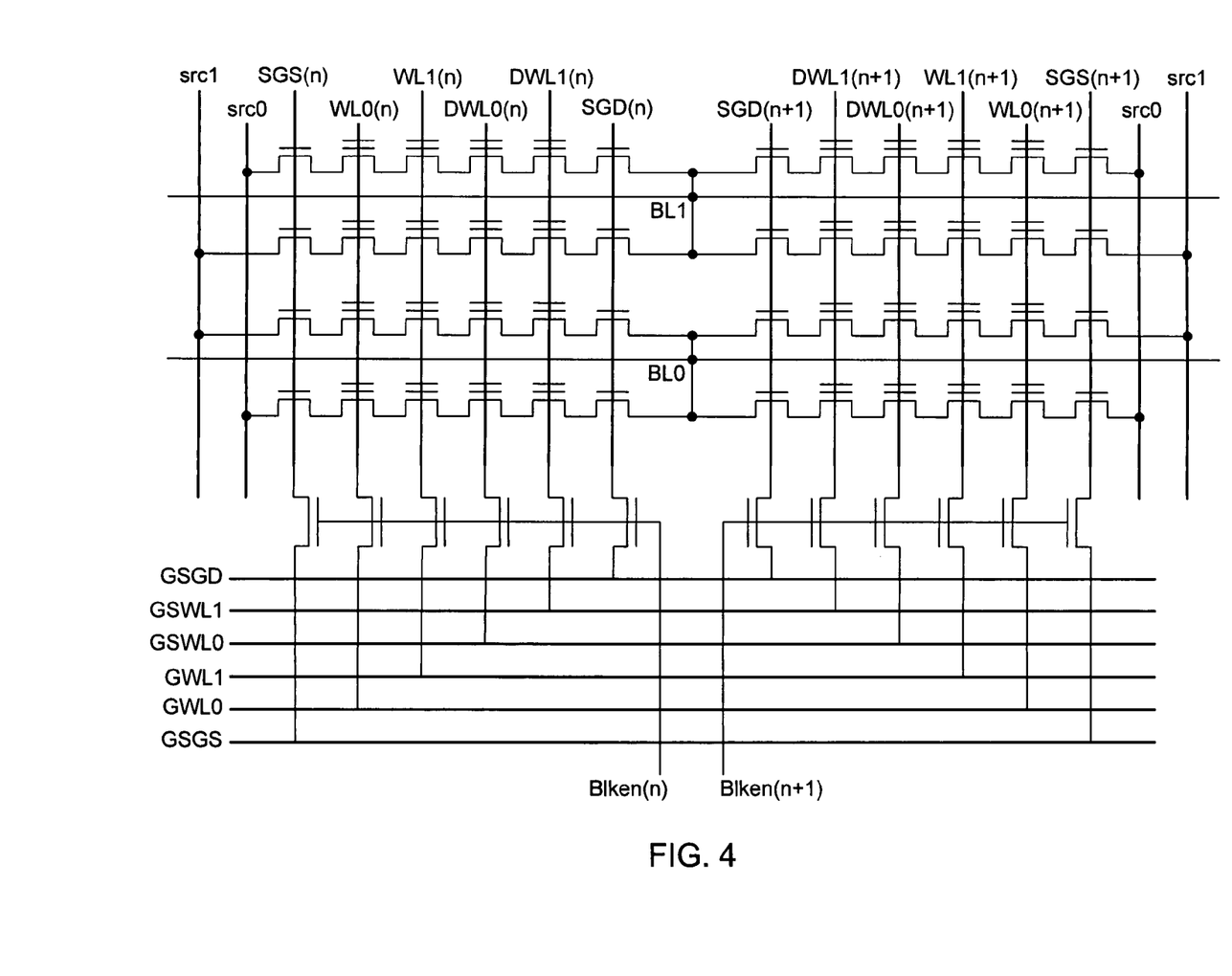
FIG. 4 is a circuit schematic of a NAND flash array having dummy memory cells.

FIG. 4 shows a circuit schematic memory array to be use in association with the following description and TABLE 2 to illustrate the operation of an embodiment of the present subject matter. For the sake of clarity, each memory string has two memory cell and two dummy memory cells. It is understood that there may be any appropriate "n" number of memory cells and any "n" number of dummy cells either proximate the select gate drain "SGD" or the select gate source "SGS".

TABLE 2 shows the biasing conditions for the memory array in FIG. 4. In read and verify modes, according to the NAND string address, either dummy wordline DWL0 or dummy wordline DWL1 is biased with high (4V) or low (1V) voltages. In program mode, dummy wordlines, DWL0 and DWL1 are de-biased like deselected wordlines in order to perform program inhibit to those cells connected to the dummy wordlines DWL0 and DWL1. In erase mode, dummy wordlines DWL0 and DWL1 are de-biased like wordlines in deselected blocks in order to perform erase inhibit. It is also possible to erase the dummy cells at the same time as erasing the selected cells followed by the dummy program, as will be understood to those skilled in the art. In dummy program mode, dummy cells are programmed to a certain level as TABLE 1 after erase operation.

TABLE 2

|  | Standby | Read | Program | Erase | Dummy Program |
| --- | --- | --- | --- | --- | --- |
| Blken(n) | 0 V | 6 V | 22 V | 6 V | 22 V |
| Blken(n + 1) | 0 V | 0 V | 0 V | 0 V | 0 V |
| BL0 | 0 V | 1 V | 2 V("1")/0 V("0") | float | 2 V("1")/0 V("0") |
| BL1 | 0 V | 0 V | 2 V | float | 2 V |
| SRC0 | 0 V | 0 V | 2 V | float | 2 V("1")/0 V("0") |
| SRC1 | 0 V | 0 V | 2 V | float | 2 V("1")/0 V("0") |
| GSGS | 0 V | 4 V | 0 V | float | 0 V |
| GWL0 | 0 V | 4 V | 8 V | 0 V | 8 V |
| GWL1 | 0 V | 0 V | 18 V | 0 V | 8 V |
| GDWL0 | 0 V | 4 V | 8 V | 6 V | 18 V |
| GDWL1 | 0 V | 1 V | 1 V | 6 V | 8 V |
| GDGD | 0 V | 4 V | 2 V | float | 2 V |
| SGS(n) | 0 V | 4 V | 0 V | float | 0 V |
| WL0(n) | float | 4 V | 8 V | 0 V | 8 V |
| WL1(n) | float | 0 V | 18 V | 0 V | 8 V |
| DWL0(n) | float | 4 V | 8 V | float | 18 V |
| DWL1(n) | float | 1 V | 1 V | float | 8 V |
| SGD(n) | 0 V | 4 V | 2 V | float | 2 V |
| SGS(n + 1) | 0 V | 0 V | 0 V | float | 0 V |
| WL0(n + 1) | float | float | float | float | float |
| WL1(n + 1) | float | float | float | float | float |
| DWL0(n + 1) | float | float | float | float | float |
| DWL1(n + 1) | float | float | float | float | float |
| SGD(n + 1) | 0 V | 0 V | 0 V | float | float |

Where:
Blken is "block enable",
BL is "bitline",
SRC is "source line",
GSGS is "global select gate source",
GWL is "global wordline",
GDGD is "global select gate drain",
SGS is "select gate source",
WL is "wordline",
DWL is "dummy word line",
SGD is "select gate drain".

Figure 5:
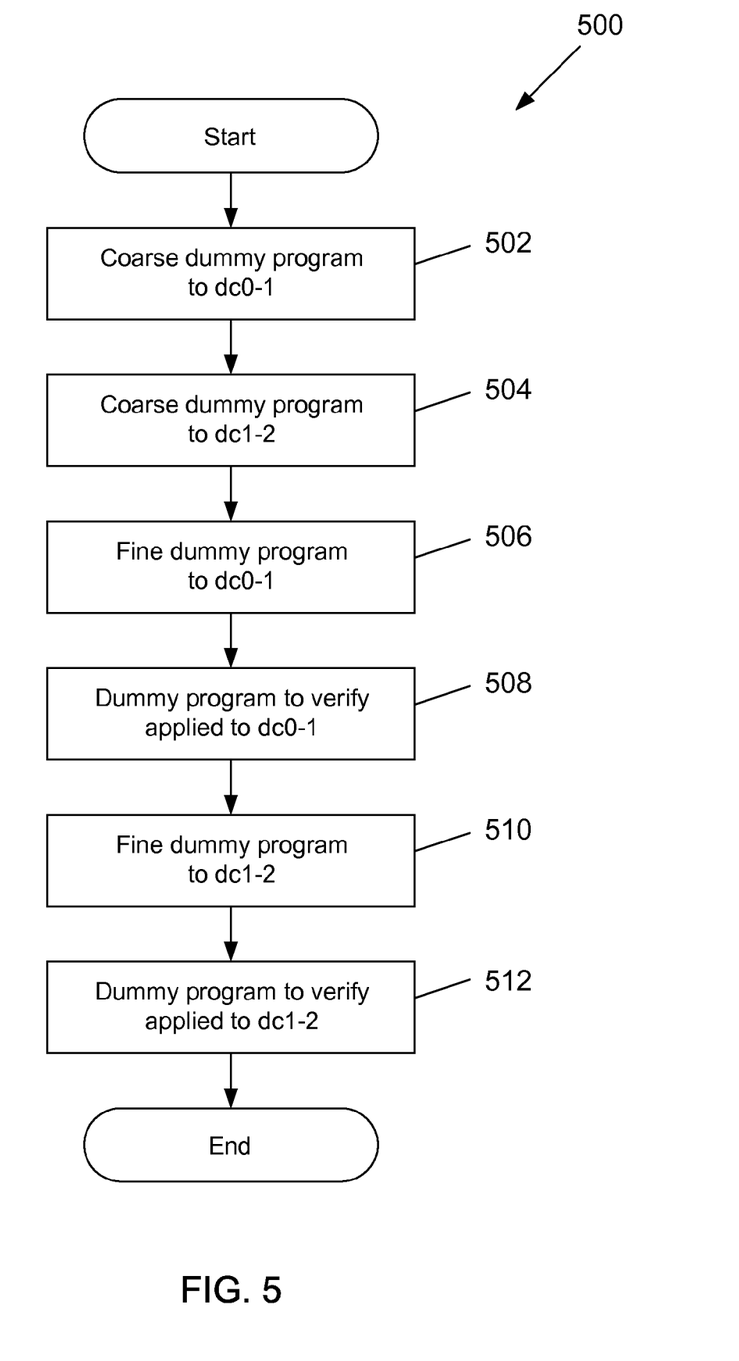
FIG. 5 illustrates a flow diagram of a dummy memory cell program sequence.

FIG. 5 illustrates a flow diagram of a dummy memory cell program sequence 500. After the erase completion, the program sequence begins with a sequential coarse program to the dummy cells (blocks 502 and 504). The coarse dummy program to dc0-1 (corresponding to the second dummy cell $208_1$ of the first memory cell string $202_1$) performed with, for example, DWL0=20V, SRC0=0V, WLi=DWL1=10V, SRC1=2V, SGD=0V, BLi=2V (where "i" is the wordline or bitline number). The coarse dummy program to dc1-2 (corresponding to the first dummy cell $206_2$ of the second memory cell string $202_2$) performed with, for example, WLi=DWL0=10V, SRC0=2V, DWL1=20V, SRC1=0V, SGD=0V, BLi=2V. Blocks 502 and 504 are program pulses applied for a certain time to make the dummy cells threshold voltages positive. Additionally, since the threshold voltages are not controlled with a program verify operation, the threshold voltages have a relatively large distribution.

A fine dummy program is then applied to dc0-1 (Block 506) with, for example, DWL0=20V, SRC0=0V, WLi=DWL1=10V, SRC1=2V, SGD=0V, BLi=2V, and then a dummy program to verify is applied to dc0-1 (Block 508) with DWL0=2V, SRC0=0V, DWL1=0V, WLi=SGD=SGS=5V, SRC1=0V. It is understood that Blocks 506 and 508 may be repeated until a threshold voltage of dc0-1 is greater than 2V.

A fine dummy program is then applied to dc1-2 (Block 510) with, for example, DWL0=0V, SRC0=2V, DWL1=20V, SRC1=0V, SRC0=2V, SGD=0V, BLi=2V, and then a dummy program to verify is applied to dc1-2 (Block 512) with DWL0=0V, SRC0=0V, DWL1=2V, WLi=SGD=SGS=5V, SRC1=0V. It is understood that Blocks 510 and 512 may be repeated until a threshold voltage of dc1-2 is greater than 2V. The dummy program is then complete.

Figure 6:
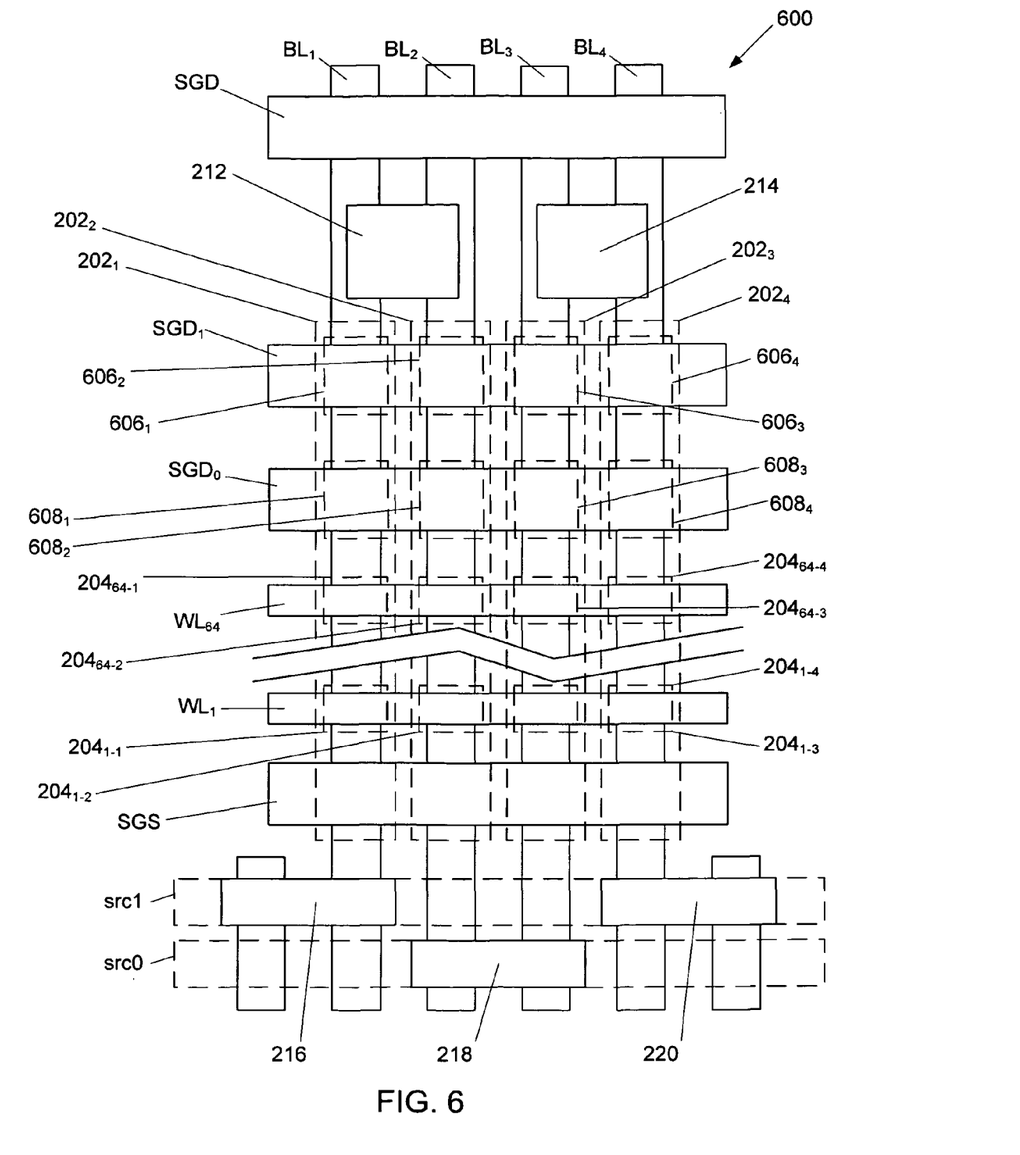
FIG. 6 is a top view of a NAND flash array having two select gate drain transistors in each memory cell string and shared bitline contacts.

FIG. 6 illustrates another embodiment of the present description of a memory cell array 600. The memory cell array 600 may include a first memory cell string $202_1$ having a number of memory cells $204_{1-1}, \ldots, 204_{64-1}$ and a second memory cell string $202_2$ having a number of memory cells $204_{1-2}, \ldots, 204_{64-2}$. As will be understood to those skilled in the art, the memory cells reside at the intersection of bitlines $BL_1, BL_2, BL_3, BL_4$ and wordlines $WL_1, \ldots, WL_{64}$. Memory cells in adjacent memory cell strings are connected through wordlines. For example, the first memory cell $204_{1-1}$ of the first memory cell string $202_1$ is connected to the first memory cell $206_{1-2}$ of the second memory cell string $202_2$ with a first wordline $WL_1$, and so on through the memory cells until the sixty-fourth memory cell $208_{64-1}$ of the first memory cell string $202_1$ is connected to the sixty-fourth memory cell $208_{64-2}$ of the second memory cell string $202_2$ with a sixty-fourth wordline $WL_{64}$.

It is understood that any appropriate number of bitlines $BL_1$, $BL_2$, $BL_3$, $BL_4$ and wordline $WL_1$, ..., $WL_{64}$ may be used to form the memory cell array 600, and the illustrated number is merely exemplary. The memory cell array 600 also includes a select gate source SGS in communication with the bitlines $BL_1$, $BL_2$, $BL_3$, $BL_4$ in the manner discussed with regard to FIG. 1.

As shown in FIG. 6, the first memory cell string $202_1$ and the second memory cell string $202_2$ may each include at least two transistors within each memory cell string that may be programmed for sharing the bitline contact, and in this embodiment shown as a first ground selection transistor gate $606_1$, $606_2$ and a second ground selection transistor gate $608_1$, $608_2$, respectively. These ground selection transistor gates operate in a manner as the dummy cells, previously described to effectuate the sharing of the bitline contacts between memory cell strings. Ground selection transistor gates in adjacent memory cell strings are connected through select gate drain. For example, the first ground selection transistor gate $606_1$ of the first memory cell string $202_1$ is connected to the first ground selection transistor gate $606_2$ of the second memory cell string $202_2$ with a first select gate drain $SGD_1$, and the second ground selection transistor gate $608_1$ of the first memory cell string $202_1$ is connected to the second ground selection transistor gate $608_2$ of the second memory cell string $202_2$ with a second select gate drain $SGD_0$.

The memory cell array 600 may further include a first bitline 212 that is connected to the first memory cell string $202_1$ and the second memory cell string $202_2$.

The memory cell array 600 may include a first source line "scr1" connected to the first memory cell string $202_1$ through a first source line contact 216 connected to bitline $BL_1$, and a second source line "scr0" connected to the second memory cell string $202_2$ through a second source line contact 218 connected to bitline $BL_2$.

As further shown in FIG. 6, the memory cell array 600 may further include a third memory cell string $202_3$ having a number of memory cells $204_{1-3}$, ..., $204_{64-3}$ and a fourth memory cell string $202_4$ having a number of memory cells $204_{1-4}$, ..., $204_{64-4}$. The third memory cell string $202_3$ and the fourth memory cell string $202_4$ may each include a first ground selection transistor gate $606_1$, $606_2$ and a second ground selection transistor gate $608_1$, $608_2$, respectively. The first ground selection transistor gate $606_3$ of the third memory cell string $202_3$ is connected to the first ground selection transistor gate $606_4$ of the fourth memory cell string $202_2$ with a first select gate drain $SGD_1$, and the second ground selection transistor gate $608_3$ of the third memory cell string $202_3$ is connected to the fourth ground selection transistor gate $608_4$ of the fourth memory cell string $202_4$ with a second select gate drain $SGD_2$.

The memory cell array 600 may further include a second bitline contact 214 that is connected to the third memory cell string $202_3$ and the fourth memory cell string $202_4$.

The first source line "scr1" may be connected to the fourth memory cell string $202_4$ through a third source line contact 220 connected to $BL_4$ and the second source line "scr0" connected to the third memory cell string $202_3$ through the second source line contact 218 connected to bitline $BL_3$, which is shared with the bitline $BL_2$ of the second memory cell string $202_2$.

It is understood that the structures of bitline active areas 302, 304, and source line active areas 322, 324, 326, as illustrated in FIG. 3 may be incorporated into the memory cell array 600 of FIG. 6. Furthermore, it is understood that the first select gate drains $606_1$ and $606_2$ and the second select gate drains $608_1$ and $608_2$, may be programming in a similar way to programming the dummy memory cells, as previously discussed.

Figure 7:
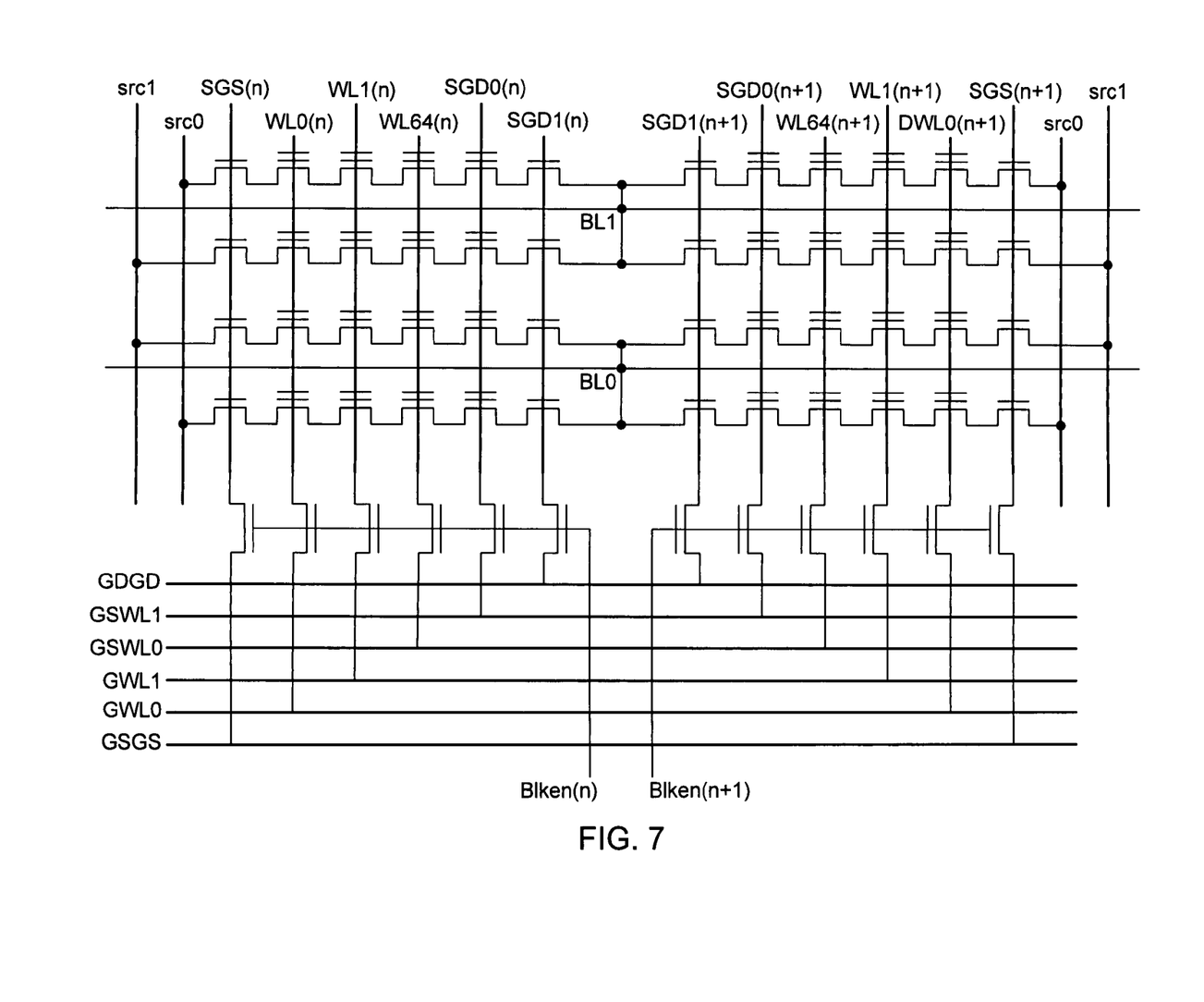
FIG. 7 is a circuit schematic of a NAND flash array having two select gate drain transistors in each memory cell string.

FIG. 7 shows a circuit schematic memory array of the memory cell array 600, which is included to more clearly define the circuitry of the memory cell array 600.

Figure 8:
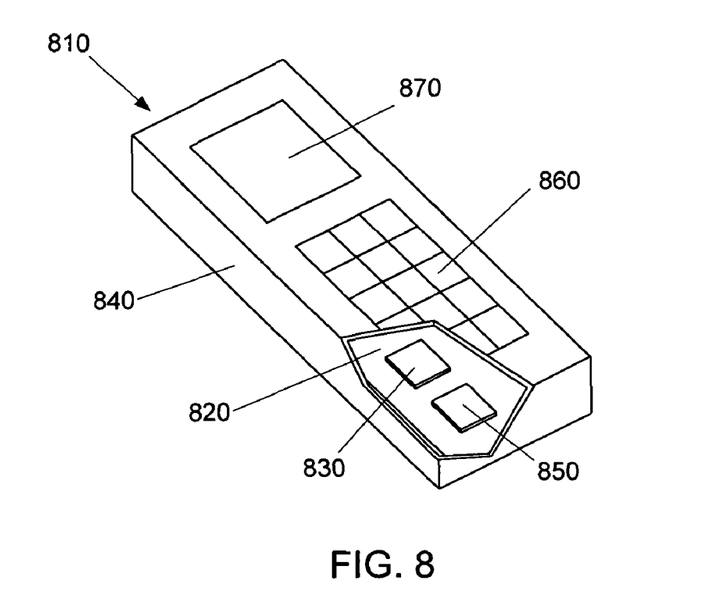
FIG. 8 illustrates an embodiment of a portable electronic device.

FIG. 8 illustrates an embodiment of a portable electronic device 810, such as a cellular telephone or a personal data assistant (PDA), digital media player, of the like. The portable device 810 may comprise a substrate 820 within a housing 830. The substrate 820 may have various electronic components electrically coupled thereto including a microprocessor 840, such as central processing units (CPUs), chipsets, graphics processor, ASICs, or other command/data processing device, and including at least one memory device 850 having at least one depletion mode circuit protection device, as described in the present description. The substrate 820 may be attached to various peripheral devices including an input device, such as keypad 860, and a display device, such an LCD display 870.

Figure 9:
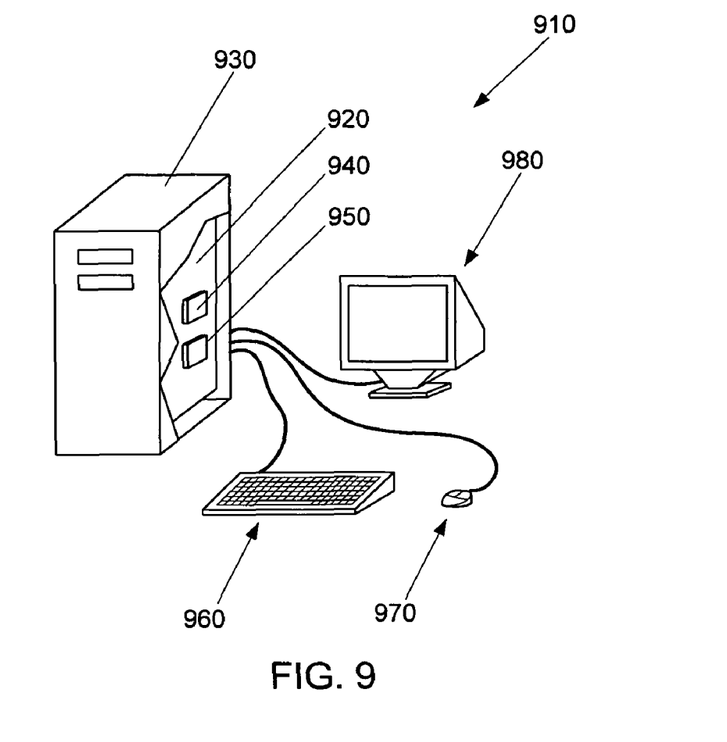
FIG. 9 illustrates an embodiment of a computer system.

FIG. 9 illustrates an embodiment of a computer system 910. The computer system 910 may comprise a substrate or motherboard 920 within a housing 930. The motherboard 920 may have various electronic component electrically coupled thereto including a microprocessor 940, such as a central processing units (CPUs), chipsets, graphics processor, ASICs, or other command/data processing device, and at least one memory device 950, including but not limited to, a BIOS chip, a solid state drive, and the like, having at least one depletion mode circuit protection device, as described above. The substrate or motherboard 920 may be attached to various peripheral devices including inputs devices, such as a keyboard 960 and/or a mouse 970, and a display device, such as a monitor 980.

Figure 10:
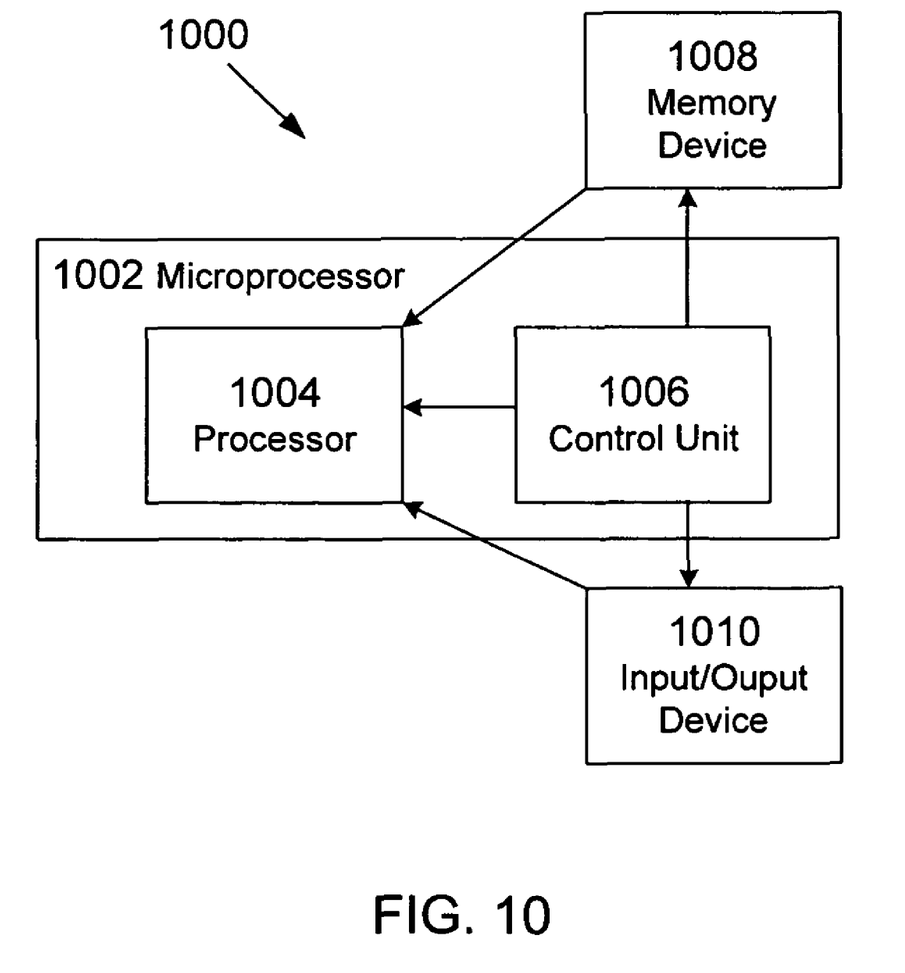
FIG. 10 is a block diagram of an electronic system.

FIG. 10 illustrates a block diagram of an electronic system 1000. The electronic system 1000 can correspond to, for example, the portable system 810 of FIG. 8, the computer system 910 of FIG. 9, a process control system, or any other system that utilizes a processor and an associated memory. The electronic system 1000 may have a microprocessor 1002 (having a processor 1004 and control unit 1006), a memory device 1008, and an input/output device 1010 (it is, of course, understood that the electronic system 1000 can have a plurality of processors, control units, memory device units and/or input/output devices in various embodiments). In one embodiment, the electronic system 1000 may have a set of instructions that define operations which are to be performed on data by the processor 1004, as well as, other transactions between the processor 1004, the memory device 1008, and the input/output device 1010. The control unit 1006 coordinates the operations of the processor 1004, the memory device 1008 and the input/output device 1010 by cycling through a set of operations that cause instructions to be retrieved from the memory device 1008 and executed. The memory device 1008 can include flash memory having at least one microelectronic cell having a depletion mode circuit protection device.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A memory cell array, comprising:
   a bitline contact connected to a first memory cell string and a second memory cell string;
   the first memory cell string including at least first and second dummy memory cells adapted to be programmed to share the bitline contact;
   the second memory cell string including at least first and second dummy memory cells adapted to be programmed to share the bitline contact;
   a first source line connected to the first memory cell string; and
   a second source line connected to the second memory cell string;
   wherein the first dummy memory cell of the first memory cell string and the second dummy memory cell of the second memory cell string are programmed in the following sequence:
   performing a coarse program operation to the first dummy memory cell of the first memory cell string;
   performing a coarse program operation to the second dummy memory cell of the second memory cell string;
   performing a fine program operation to the first dummy memory cell of the first string;
   performing a program verify operation on the first dummy memory cell of the first string
   performing a fine program operation to the second dummy memory cell of the second string; and
   performing a program verify operation on the second dummy memory cell of the second string.

2. The memory cell array of claim 1, wherein the first memory cell string further comprises at least two ground selection transistors, and wherein the second memory cell string further comprises at least two ground selection transistors.

3. A memory cell array, comprising:
   a first memory cell string including at least two dummy memory cells;
   a second memory cell string including at least two dummy memory cells;
   a first bitline contact connected to the first memory cell string and the second memory cell string;
   a first source line connected to the first memory cell string;
   a second source line connected to the second memory cell string;
   wherein a dummy memory cell of the first memory cell string and a dummy memory cell of the second memory cell string are programmed in the following sequence:
   performing a coarse program operation to the dummy memory cell of the first memory cell string;
   performing a coarse program operation to the dummy memory cell of the second memory cell string;
   performing a fine program operation to the dummy memory cell of the first string;
   performing a program verify operation on the dummy memory cell of the first string
   performing a fine program operation to the dummy memory cell of the second string; and
   performing a program verify operation on the dummy memory cell of the second string.

4. The memory cell array of claim 3, wherein a first dummy memory cell of the first memory cell string is connected to a first dummy memory cell of the second memory cell string.

5. The memory cell array of claim 4, wherein a threshold voltage of the first dummy memory cell of the first memory cell string is programmed to a different threshold voltage than the first dummy memory cell of the second memory cell string.

6. The memory cell array of claim 3, wherein a second dummy memory cell of the first memory cell string is connected to a second dummy memory cell of the second memory cell string.

7. The memory cell array of claim 6, wherein a threshold voltage of the second dummy memory cell of the first memory cell string is programmed to a different threshold voltage than the second dummy memory cell of the second memory cell string.

8. The memory cell array of claim 3, comprising:
a third memory cell string including at least two dummy memory cells;
a fourth memory cell string including at least two dummy memory cells;
a second bitline contact connected to the third memory cell string and the fourth memory cell string;
the first source line connected to the fourth memory cell string; and
the second source line connected to the third memory cell string.

9. A memory cell array, comprising:
a first memory cell string including at least two ground selection transistors;
a second memory cell string including at least two ground selection transistors;
a first bitline contact connected to the first memory cell string and the second memory cell string;
a first source line connected to the first memory cell string;
a second source line connected to the second memory cell string;
wherein a ground selection transistor of the first memory cell string and a ground selection transistor of the second memory cell string are programmed in the following sequence:
performing a coarse program operation to the ground selection transistor of the first memory cell string;
performing a coarse program operation to the ground selection transistor of the second memory cell string;
performing a fine program operation to the ground selection transistor of the first string;
performing a program verify operation on the ground selection transistor of the first string;
performing a fine program operation to the round selection transistor of the second string; and
performing a program verify operation on the ground selection transistor of the second string.

10. The memory cell array of claim 9, wherein a first ground selection transistor of the first memory cell string is connected to a first ground selection transistor of the second memory cell string.

11. The memory cell array of claim 10, wherein a threshold voltage of the first ground selection transistor of the first memory cell string is programmed to a different threshold voltage than the first ground selection transistor of the second memory cell string.

12. The memory cell array of claim 9, wherein a second ground selection transistor of the first memory cell string is electrically coupled to a second ground selection transistor of the second memory cell string.

13. The memory cell array of claim 12, wherein a threshold voltage of the second ground selection transistor of the first memory cell string is programmed to a different threshold voltage than the second ground selection transistor of the second memory cell string.

14. The memory cell array of claim 9, comprising:
a third memory cell string including at least two ground selection transistors;
a fourth memory cell string including at least two ground selection transistors;
a second bitline contact connected to the third memory cell string and the fourth memory cell string;
the first source line connected to the fourth memory cell string;
and the second source line connected to the third memory cell string.

15. An electronic system, comprising:
a processor; and
a memory device in data communication with the processor, the memory device comprising memory cell array including:
a first bitline contact connected to a first memory cell string and a second memory cell string;
the first memory cell string including at least first and second dummy memory cells adapted to be programmed to share the first bitline contact;
the second memory cell string including at least first and second dummy memory cells adapted to be programmed to share the first bitline contact and a first memory cell coupled to the first word line;
a first source line connected to the first memory cell string; and
a second source line connected to the second memory cell string;
wherein the first dummy memory cell of the first memory cell string and the second dummy memory cell of the second memory cell string are programmed in the following sequence:
performing a coarse program operation to the first dummy memory cell of the first memory cell string;
performing a coarse program operation to the second dummy memory cell of the second memory cell string;
performing a fine program operation to the first dummy memory cell of the first string;
performing a program verify operation on the first dummy memory cell of the first string;
performing a fine program operation to the second dummy memory cell of the second string; and
performing a program verify operation on the second dummy memory cell of the second string.

16. The electronic system of claim 15, wherein the first dummy memory cell of the first memory cell string is connected to the first dummy memory cell of the second memory cell string.

17. The electronic system of claim 16, wherein the threshold voltage of the first dummy memory cell of the first memory cell string is adapted to be programmed to a different threshold voltage than the first dummy memory cell of the second memory cell string.

18. The electronic system of claim 15, wherein the second dummy memory cell of the first memory cell string is connected to the second dummy memory cell of the second memory cell string.

19. The electronic system of claim 18, wherein a threshold voltage of the second dummy memory cell of the first memory cell string is programmed to a different threshold voltage than the second dummy memory cell of the second memory cell string.

20. The electronic system of claim 15, comprising:
a third memory cell string including a plurality of memory cells and at least two dummy memory cells;

a fourth memory cell string including a plurality of memory cells and at least two dummy cells;

a second bitline contact connected to the third memory cell string and the fourth memory cell string;

the first source line connected to the fourth memory cell string; and the second source line connected to the third memory cell string.

21. The electronic system of claim 15, wherein the first memory cell string further comprises at least two ground selection transistors, and wherein the second memory cell string further comprises at least two ground selection transistors.

22. The electronic system of claim 21, wherein a first ground selection transistor of the first memory cell string is connected to a first ground selection transistor of the second memory cell string.

23. The electronic system of claim 22, wherein a threshold voltage of the first ground selection transistor of the first memory cell string is programmed to a different threshold voltage than the first ground selection transistor of the second memory cell string.

24. The electronic system of claim 21, wherein a second ground selection transistor of the first memory cell string is connected to a second ground selection transistor of the second memory cell string.

25. The electronic system of claim 24, wherein a threshold voltage of the second ground selection transistor of the first memory cell string is programmed to a different threshold voltage than the second ground selection transistor of the second memory cell string.

26. The electronic system of claim 21, comprising:

a third memory cell string including at least two ground selection transistors;

a fourth memory cell string including at least two ground selection transistors;

a second bitline contact connected to the third memory cell string and the fourth memory cell string;

the first source line connected to the fourth memory cell string; and the second source line connected to the third memory cell string.

* * * * *

UNITED STATES PATENT AND TRADEMARK OFFICE
CERTIFICATE OF CORRECTION

| | | |
|---|---|---|
| PATENT NO. | : 8,208,305 B2 | Page 1 of 1 |
| APPLICATION NO. | : 12/655157 | |
| DATED | : June 26, 2012 | |
| INVENTOR(S) | : Toru Tanzawa | |

It is certified that error appears in the above-identified patent and that said Letters Patent is hereby corrected as shown below:

In column 11, line 46, in claim 9, delete "round" and insert -- ground --, therefor.

Signed and Sealed this
Twenty-fifth Day of September, 2012

David J. Kappos
*Director of the United States Patent and Trademark Office*